US012631707B2

(12) United States Patent
Wiesinger et al.

(10) Patent No.: US 12,631,707 B2
(45) Date of Patent: May 19, 2026

(54) SYSTEMS AND METHODS FOR QUANTITATIVE MAGNETIC RESONANCE IMAGING

(71) Applicant: GE Precision Healthcare LLC, Waukesha, WI (US)

(72) Inventors: Florian Wiesinger, Bavaria (DE); Rolf Schulte, Bavaria (DE)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 234 days.

(21) Appl. No.: 18/587,686

(22) Filed: Feb. 26, 2024

(65) Prior Publication Data

US 2025/0271526 A1    Aug. 28, 2025

(51) Int. Cl.
| | |
|---|---|
| *G01R 33/56* | (2006.01) |
| *G01R 33/50* | (2006.01) |
| *G01R 33/58* | (2006.01) |

(52) U.S. Cl.
CPC ......... *G01R 33/5602* (2013.01); *G01R 33/50* (2013.01); *G01R 33/5608* (2013.01); *G01R 33/583* (2013.01)

(58) Field of Classification Search
CPC ............... G01R 33/50; G01R 33/5602; G01R 33/5608; G01R 33/583
See application file for complete search history.

(56) References Cited

U.S. PATENT DOCUMENTS

| | | | | |
|---|---|---|---|---|
| 10,290,103 B2 * | 5/2019 | Warntjes | ............. | G01R 33/5608 |
| 11,079,448 B2 * | 8/2021 | Griswold | ............... | A61B 5/055 |
| 12,306,277 B2 * | 5/2025 | Hsu | .................... | G01R 33/5616 |

OTHER PUBLICATIONS

Wiesinger, F. et al., "Zero TE MR bone imaging in the head," Magnetic Resonance in Medicine, vol. 75, No. 1, Jan. 2016, Available Online Jan. 16, 2015, 8 pages.

Gomez, P. et al., "Designing contrasts for rapid, simultaneous parameter quantification and flow visualization with quantitative transient-state imaging," Scientific Reports, vol. 9, No. 1, Jun. 11, 2019, 12 pages.

Ljunberg, E. et al., "Silent zero TE MR neuroimaging: Current state-of-the-art and future directions," Progess in Nuclear Magnetic Resonance Spectroscopy, vol. 123, Apr. 2021, 21 pages.

Wiesinger, F. et al., "3D Silent Parameter Mapping: Further refinements & quantitative assessment," International Society for Magnetic Resonance in Medicine Website, Available Online at https://cds.ismrm.org/protected/21MProceedings/PDFfiles/1828.html, Available as Early as Apr. 30, 2021, 2 pages.

* cited by examiner

*Primary Examiner* — Gregory H Curran

(74) *Attorney, Agent, or Firm* — McCoy Russell LLP

(57) ABSTRACT

Systems and methods are provided for quantitative parameter estimation for magnetic resonance (MR) imaging. In one example, a method includes performing a steady-state acquisition to obtain first MR signals of a scan volume, performing a transient-state acquisition to obtain second MR signals of the scan volume, determining, for each voxel of the scan volume, a respective proton density (PD) based on the first MR signals, determining, for each voxel of the scan volume, one or more respective quantitative MR (qMR) parameters based on the second MR signals and the PD for that voxel, and outputting one or more parameter maps for display and/or storage based on the one or more respective qMR parameters.

20 Claims, 11 Drawing Sheets

300

START

302
MEASURE PD USING STEADY-STATE
ACQUISITION

304
PERFORM COIL SENSITIVITY MAPPING
USING MEASURED PD

306
PERFORM PARAMETER MAPPING USING
MEASURED PD

308
ITERATIVELY CORRECT PD FOR T1
SATURATION

END

SYSTEMS AND METHODS FOR QUANTITATIVE MAGNETIC RESONANCE IMAGING

TECHNICAL FIELD

The present description relates generally to medical imaging. More specifically, the present disclosure relates to quantitative magnetic resonance imaging.

BACKGROUND

Magnetic resonance imaging (MRI) is a medical imaging modality that can create images of the inside of a human body without using x-rays or other ionizing radiation. An MRI scan typically includes a series of radiofrequency (RF) excitation pulses and magnetic field gradient pulses that are played out with specific timings and in a specific sequence to prepare contrast and encode spatial information into the signal to generate an image. To enhance certain anatomical features, some MRI scans may include the administration of a contrast agent to a subject being imaged.

BRIEF DESCRIPTION

In one example, a method includes performing a steady-state acquisition to obtain first MR signals of a scan volume, performing a transient-state acquisition to obtain second MR signals of the scan volume, determining, for each voxel of the scan volume, a respective proton density (PD) based on the first MR signals, determining, for each voxel of the scan volume, one or more respective quantitative MR (qMR) parameters based on the second MR signals and the PD for that voxel, and outputting one or more parameter maps for display and/or storage based on the one or more respective qMR parameters.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present disclosure will be better understood from reading the following description of non-limiting embodiments, with reference to the attached drawings, wherein below.

DETAILED DESCRIPTION

Figure 1:
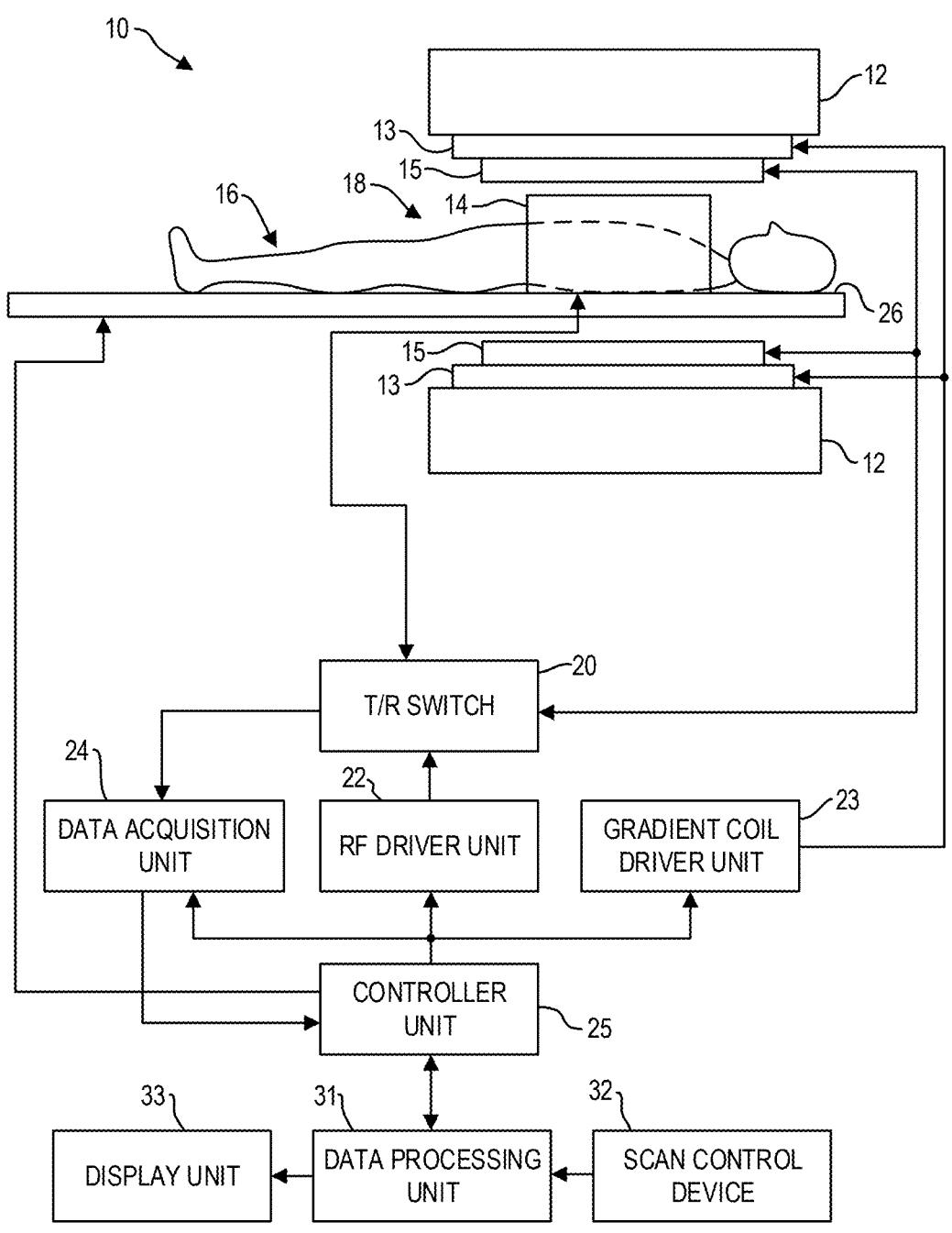
FIG. 1 is a block diagram of an MRI apparatus according to an embodiment of the disclosure.

The following description relates to quantitative magnetic resonance imaging (qMRI). Quantitative MRI typically includes MR signal acquisition during transient states of magnetization in order to quantify various parameters of interest, such as proton density, T1, T2, and T2*. Quantitative MRI may be performed using a variety of pulse sequences, such as Modified Look-Locker Inversion (MOLLI), MAGnetic resonance imaging Compilation (MAGIC), QALAS, magnetic resonance fingerprinting (MRF), DESPOT, SETI, or modifications thereof, that typically measure multiple parameters in one scan (e.g., referred to as multi-parameter mapping). Quantitative parameter mapping using MRI (qPM) aims to estimate N unknown MR properties (e.g., T1, T2, etc.) from a set of M measurements, where each measurement is obtained with distinct parameter settings based on a physics-inspired, non-linear signal model that includes proton density as a scaling factor that is estimated from the set of measurements (e.g., the overall signal intensity may be scaled based on proton density). In typical qPM methods, the proton density is estimated from the measurements that are performed to estimate the MR parameters such as T1 and T2. As such, a relatively high number of unknowns are estimated from the measurements, increasing the complexity of the estimation and reducing the accuracy.

According to embodiments disclosed herein, the proton density (PD) may be directly measured in a separate, steady-state acquisition that uses a gradient echo (e.g., spoiled gradient echo (SPGR), fast imaging with steady-state precession (FISP), etc.), ultra-short TE (UTE), or zero-TE (ZTE) sequence with parameters, such as flip angle (FA) and repetition time (TR), selected to facilitate measurement of the PD. The steady-state sequence may include read-out (e.g., MR signal acquisition) when the longitudinal magnetization induced by the RF pulse has reached steady-state (e.g., is not changing). The RF pulse may have a low FA (e.g., less than 5°, such as around 1-3°) and a TR that is small relative to the T1 (e.g., longitudinal relaxation time) of the tissue being imaged in order to minimize T1 weighting. The other parameters of interest (e.g., T1, T2, etc.) may be quantified based on the MR signals obtained during the transient-state acquisition wherein the induced magnetization is changing. By measuring the PD during a steady-state acquisition, the number of unknowns in the parameter estimation may be reduced, which may improve the conditioning of the inverse, non-linear problem and reduce cross-talk between the unknown parameters. For example, the non-linear qPM estimation may be performed in the spatial domain for each voxel separately by mapping MR measurements (e.g., signal evolutions) to parameter values using dictionary matching. In case of dictionary matching, by measuring the PD, the cross-correlation based parameter estimation (which is known to be imperfect with respect to normalization of the dictionary atoms and hence susceptible to cross-talk) may be replaced with more robust least-square fitting.

Additionally (or alternatively), the PD measurement permits coil sensitivity calibration for parallel imaging. Parallel imaging includes MR signal acquisition via multiple RF coils simultaneously to expedite scan times. The MR signals acquired by each RF coil may be reconstructed into single-coil images that are combined in a weighted manner to produce an image, wherein the weighted combination is based on each RF coil's sensitivity. Typically, RF coil sensitivity is determined by generating coil sensitivity maps in a pre-scan calibration phase. As can be shown mathematically, using the measured PD directly as pseudo coil sensitivity maps fulfills two purposes at once, including elimination of the PD as unknown in the qPM signal equation and coil sensitivity calibration for parallel imaging.

Figure 5:
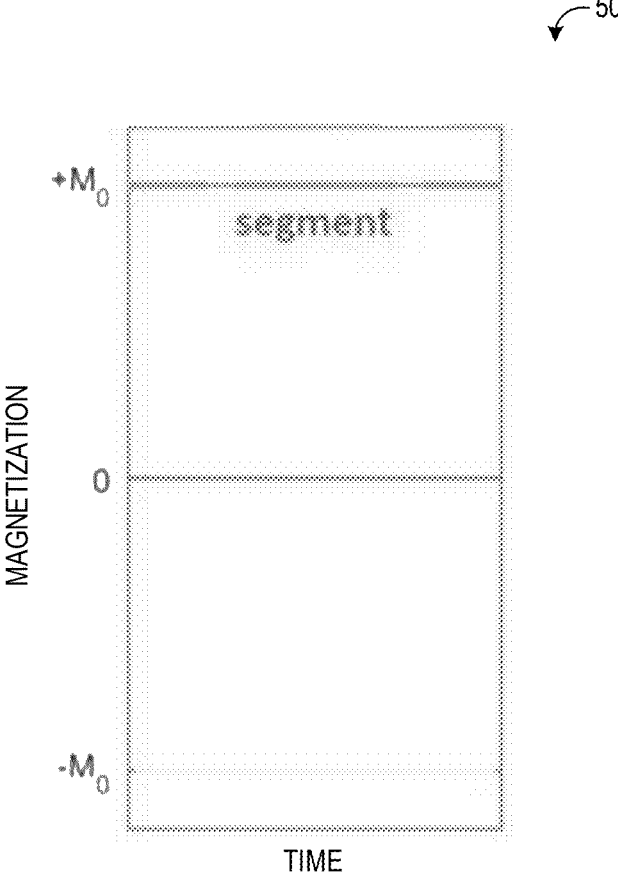
FIG. 5 is an example plot showing image acquisition segments during a steady-state acquisition for measuring PD.
Figure 6:
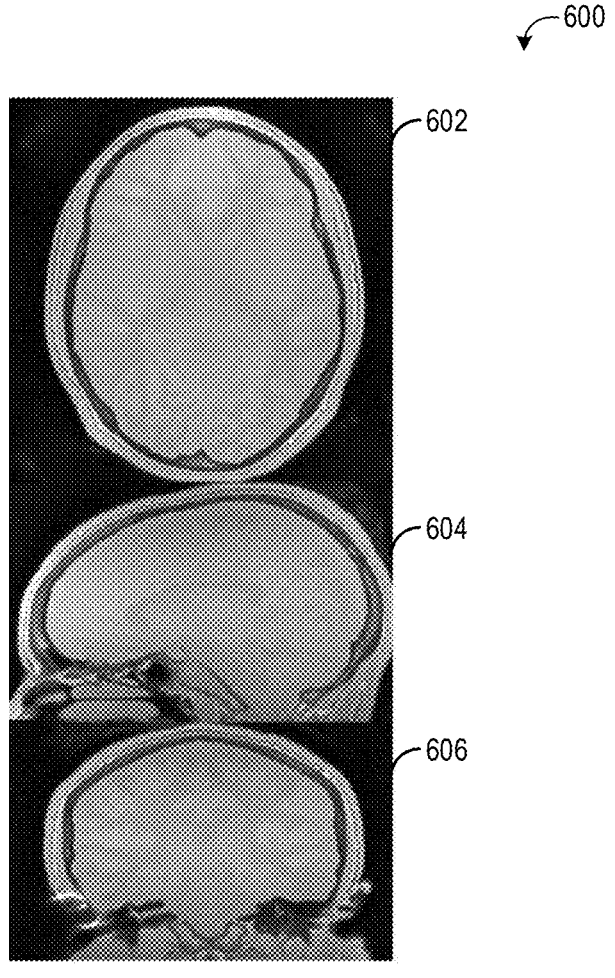
FIG. 6 shows example PD images reconstructed from k-space data of the image acquisition segments of FIG. 5.
Figure 7:
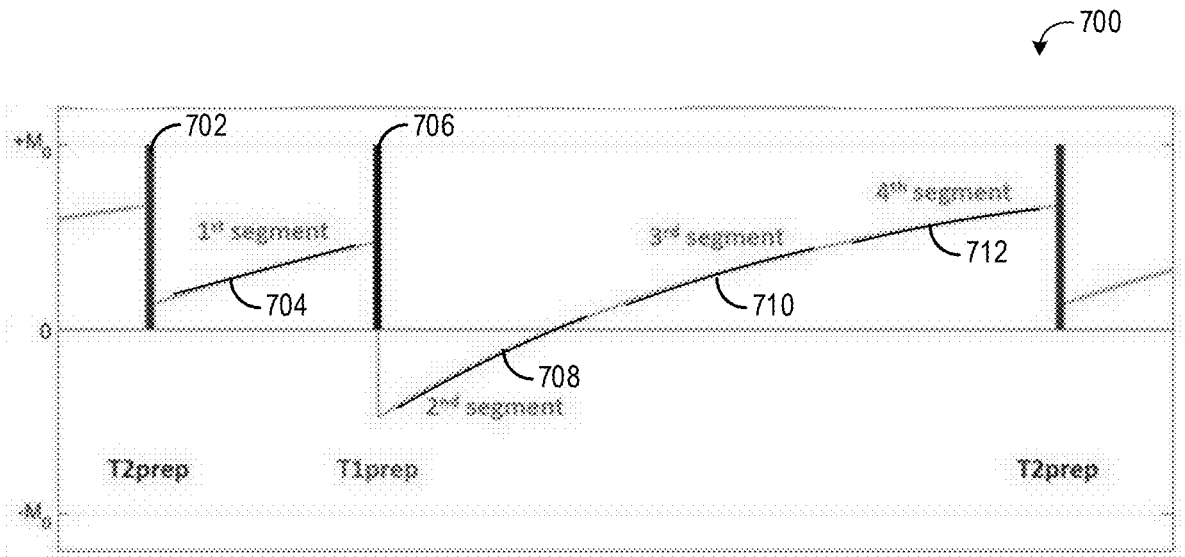
FIG. 7 is an example plot showing image acquisition segments during a transient-state acquisition for quantitative parameter mapping.
Figure 8:
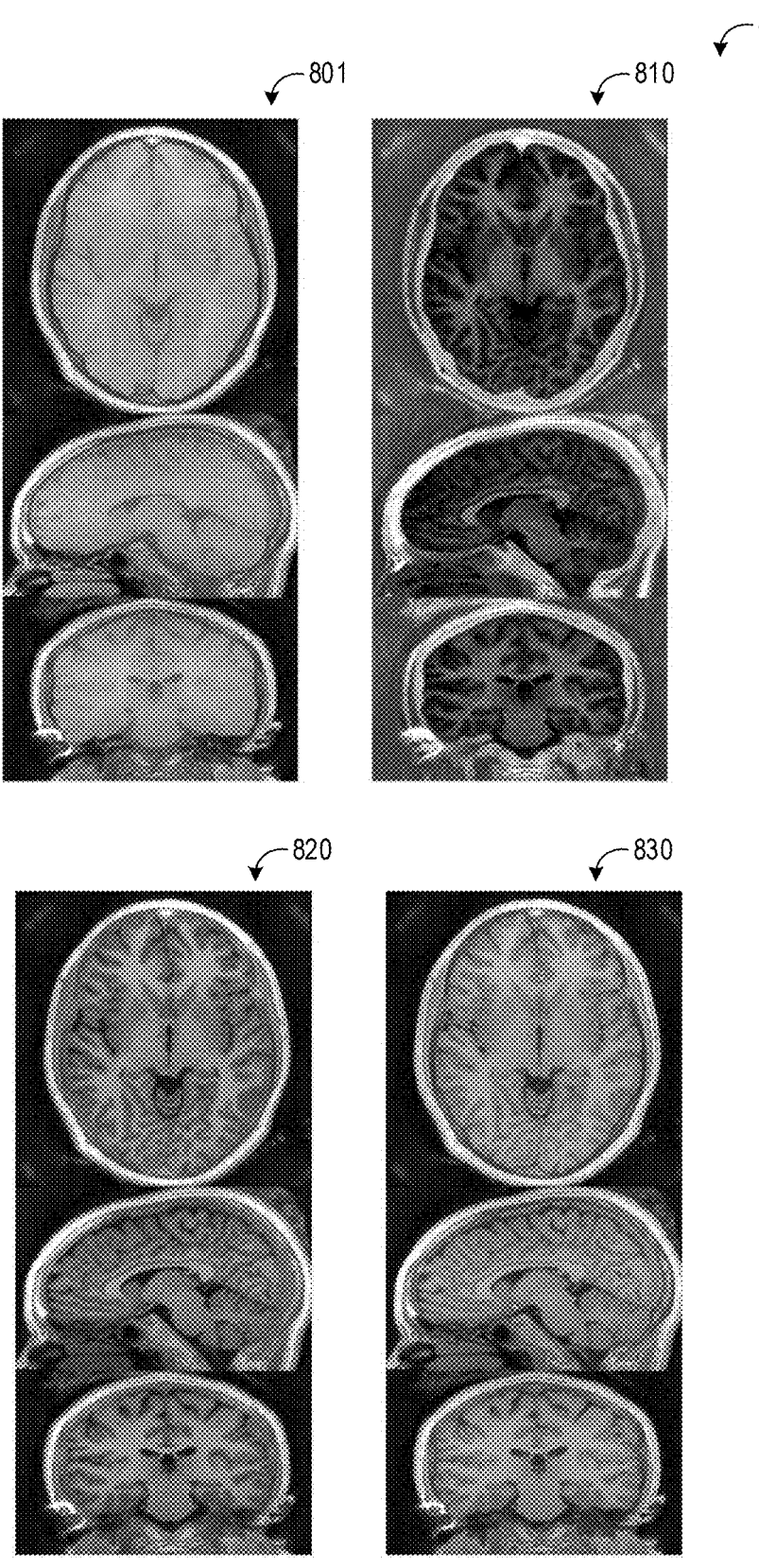
FIG. 8 shows example T2-weighted and T1-weighted images reconstructed from k-space data of the image acquisition segments of FIG. 7.
Figure 9:
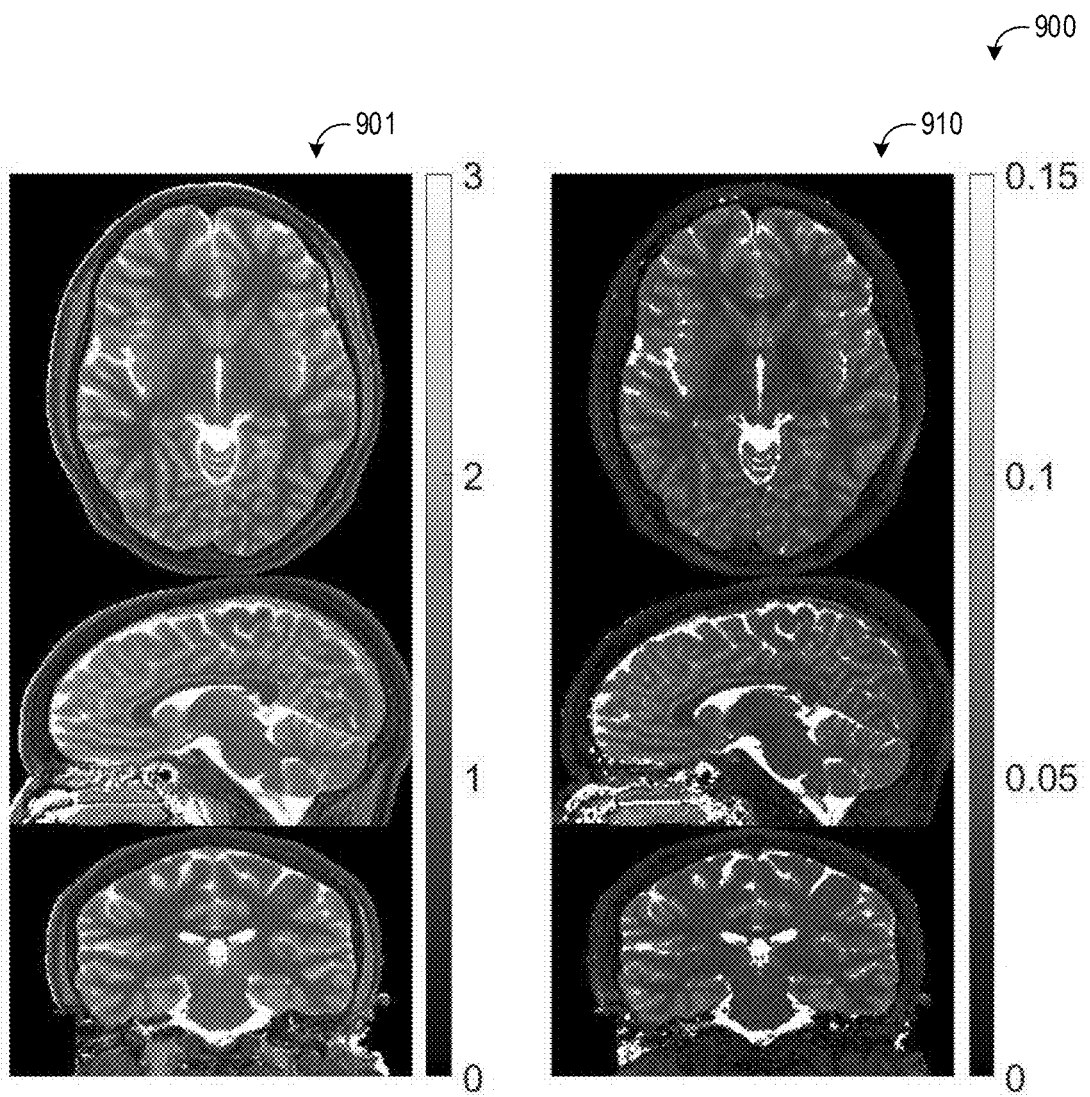
FIG. 9 shows first example parameter maps that may be obtained from the images obtained during the steady-state acquisition of FIG. 5 and the transient-state acquisition of FIG. 6.
Figure 10:
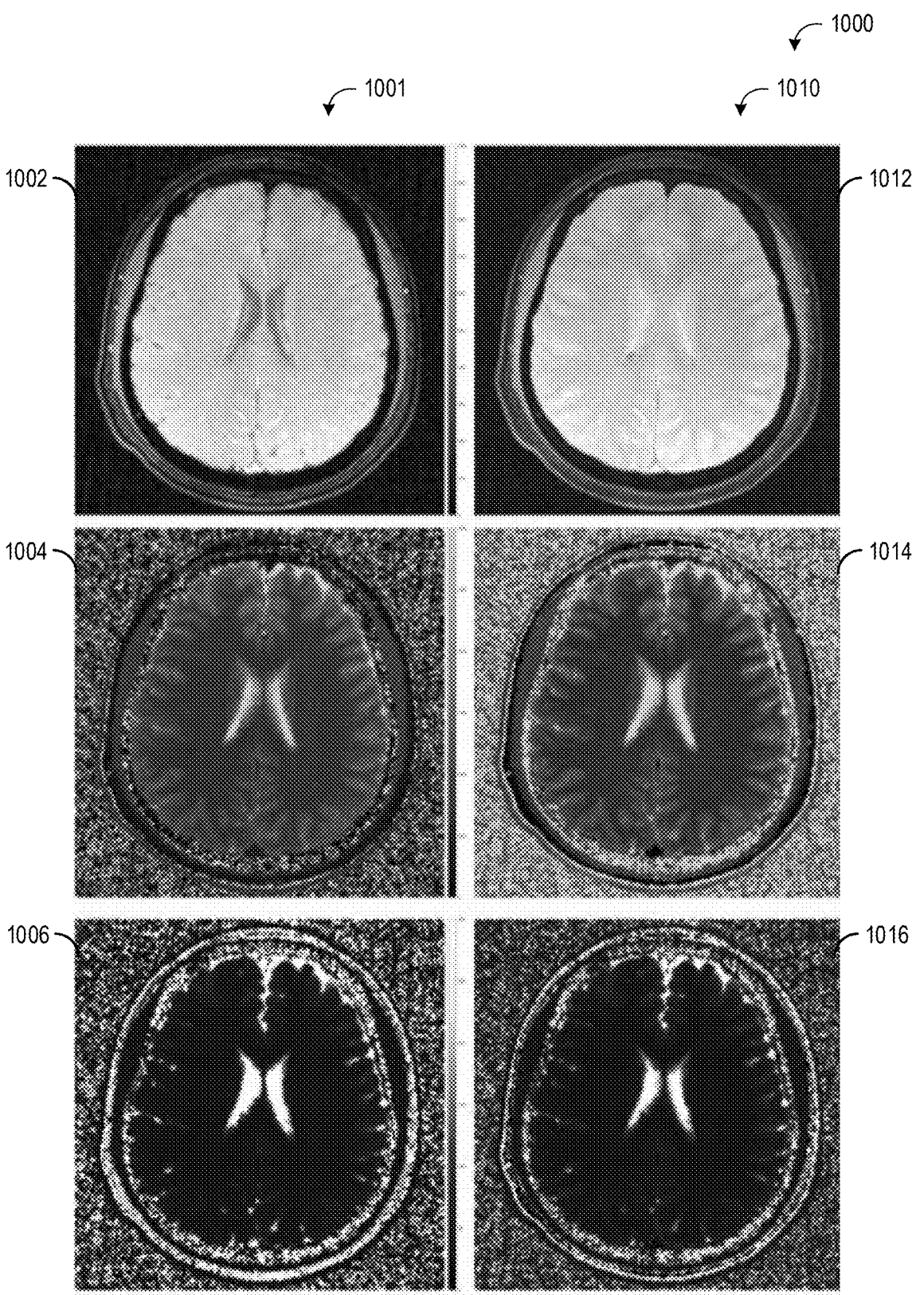
FIG. 10 shows second example parameter maps that may be obtained according to the method of FIG. 4.

An example MRI apparatus that may be used to obtain MR signals of an imaging subject is shown in FIG. 1. The MRI apparatus may include a scan control device, such as the scan control device of FIG. 2, configured to control the scan parameters of the MRI apparatus (e.g., command the MRI apparatus to execute the steady-state and transient-state acquisitions as disclosed herein) and perform quantitative parameter mapping from the obtained MR signals, according to the methods of FIGS. 3 and 4. In some examples, the steady-state acquisition may be performed in segments, as shown in FIG. 5, in order to measure PD, example PD images of which are shown in FIG. 6. In some examples, the transient acquisition may be performed in segments as shown in FIG. 7 for quantitative parameter mapping while FIG. 8 shows example T2-weighted and T1-weighted images reconstructed from k-space data of the image acquisition segments of FIG. 7. Example parameter maps that may be obtained from the images obtained during the steady-state acquisition of FIG. 5 and the transient-state acquisition of FIG. 7 are shown in FIG. 9, while FIG. 10 shows second example parameter maps that may be obtained according to the method of FIG. 4. In some examples, the initial measured PD may be corrected based on initial T1 values to account for T1 saturation effects and facilitate higher FAs and thus higher signal to noise ratio, as demonstrated by the plots of FIG. 11.

FIG. 1 illustrates an MRI apparatus 10 (e.g., an MRI system) that includes a magnetostatic field magnet unit 12, a gradient coil unit 13, an RF coil unit 14, an RF body coil unit 15 (e.g., volume coil unit), a transmit/receive (T/R) switch 20, an RF driver unit 22, a gradient coil driver unit 23, a data acquisition unit 24, a controller unit 25, a patient bed or table 26, a data processing unit 31, a scan control device 32, and a display unit 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface of the RF coil unit 14 receives the MR signals. As such, the transmit body coil (e.g., RF body coil unit 15) and the surface receive coil (e.g., RF coil unit 14) are separate but electromagnetically coupled components. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF body coil unit 15 transmits, based on a control signal from the controller unit 25, an RF pulse that is an electromagnet wave to the subject 16 and thereby generates a high-frequency magnetic field $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF body coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF body coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to predetermined scanning. The recording medium may comprise, for example, a ROM, flexible disk, hard disk, optical disk, magneto-optical disk, CD-ROM, or non-volatile memory card. The controller unit 25 is connected to the scan control device 32 and processes the operation signals input to the scan control device 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the scan control device 32.

The scan control device 32 includes user input devices such as a touchscreen, keyboard and a mouse. The scan control device 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the scan control device 32. The display unit 33 also displays a two-dimensional (2D) slice image or three-dimensional (3D) image of the subject 16 generated by the data processing unit 31.

During an MRI scan using the MRI apparatus 10, a subject may be positioned within the imaging space 18 and an acquisition protocol may be carried out to obtain MR signals of the subject. The acquisition protocol may include a plurality of pulse sequences where in each pulse sequence, contrast is prepared via one or more RF pulses applied by the RF body coil unit 15 and the gradient coil unit 13 is controlled to spatially encode the resultant MR signals. The spatially-encoded MR signals are received by the RF coil unit 14 are digitized and stored in k-space. Thus, k-space data or a k-space dataset may refer to the raw MR signals prior to processing into an image. In some examples, one line of k-space may be filled with the raw MR signals per pulse sequence (also referred to as repetition time). In other examples, one line of k-space may be filled with the raw MR signals per echo, where more than one echo is generated per pulse sequence/repetition time. The k-space data may also be referred to as imaging data or MR data herein.

Figure 2:
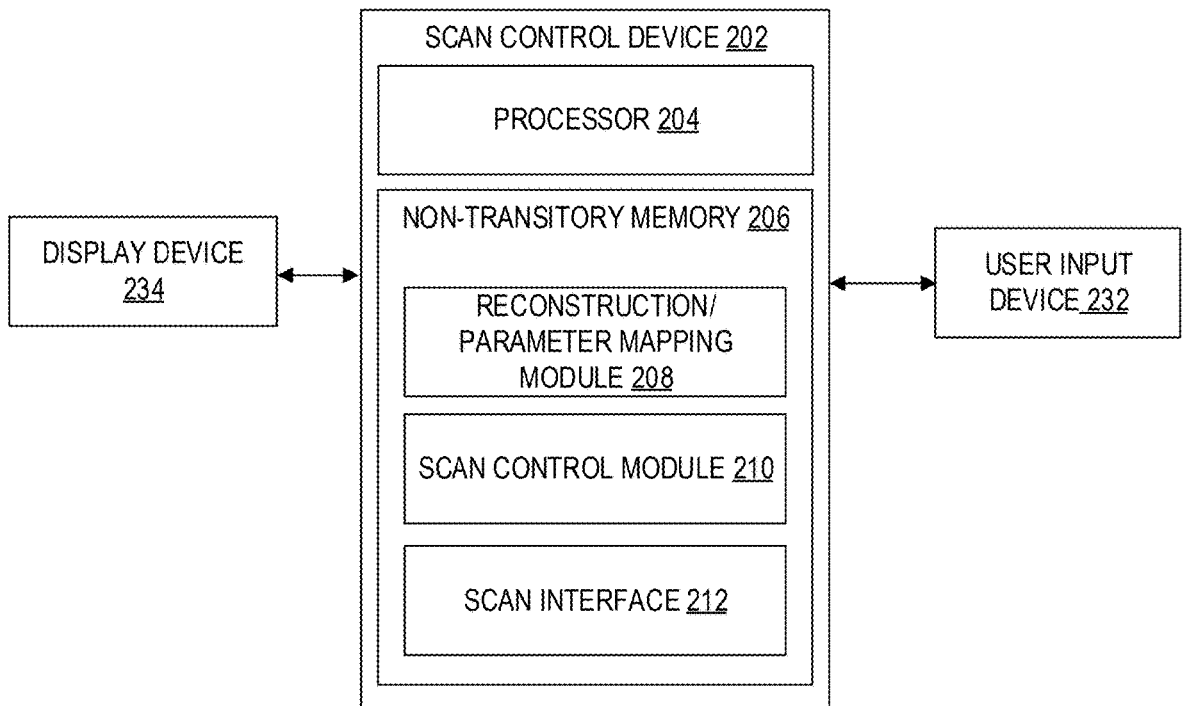
FIG. 2 schematically shows an example scan control device of the MRI apparatus of FIG. 1.

Referring to FIG. 2, scan control device 202 configured to control scan parameters of an MRI scan is shown. In some embodiments, scan control device 202 is incorporated into the MRI apparatus 10. For example, scan control device 202 may be provided in the MRI apparatus 10 as scan control device 32. In some embodiments, at least a portion of scan control device 202 is disposed at a device (e.g., edge device, server, etc.) communicably coupled to the MRI apparatus 10 via wired and/or wireless connections. In some embodiments, at least a portion of scan control device 202 is disposed at a separate device (e.g., a workstation) which can communicate with the controller unit of the MRI apparatus, for example. Scan control device 202 may be operably/communicatively coupled to a user input device 232 and a display device 234. In some examples, the user input device 232 may be the user input device of scan control device 32, explained above. Likewise, display device 234 may be the display unit 33 of MRI apparatus 10.

Scan control device 202 includes one or more processors, such as processor 204, configured to execute machine readable instructions stored in non-transitory memory 206. Processor 204 may be single core or multi-core, and the programs executed thereon may be configured for parallel or distributed processing. In some embodiments, processor 204 may optionally include individual components that are distributed throughout two or more devices, which may be remotely located and/or configured for coordinated processing. In some embodiments, one or more aspects of processor 204 may be virtualized and executed by remotely-accessible networked computing devices configured in a cloud computing configuration.

Non-transitory memory 206 may store a reconstruction/parameter mapping module 208, a scan control module 210, and a scan interface 212. Reconstruction/parameter mapping module 208 may be configured to reconstruct images and/or perform parameter mapping from k-space data. In some examples, reconstruction/parameter mapping module 208 may be the data processing unit 31 of FIG. 1, such that the data processing unit and scan control device are integrated into a single device.

Scan control module 210 may be configured to send commands to the MRI apparatus (e.g., to controller unit 25) in order to control aspects of a scan carried out by the MRI apparatus. Scan control module 210 may control aspects of the scan based on user input, which may be received via the scan interface 212, in some examples. For example, the scan interface 212 may include a scan prescription display panel via which a user may set parameters for the scan (e.g., whether parameter mapping is to be performed, if the scan is to include parallel imaging, etc.).

In some embodiments, non-transitory memory 206 may include components disposed at two or more devices, which may be remotely located and/or configured for coordinated processing. In some embodiments, one or more aspects of non-transitory memory 206 may include remotely-accessible networked storage devices configured in a cloud computing configuration.

User input device 232 may comprise one or more of a touchscreen, a keyboard, a mouse, a trackpad, a motion sensing camera, or other device configured to enable a user to interact with and manipulate data within scan control device 202. In one example, user input device 232 may enable a user to make a selection of a scan protocol, adjust scan prescription settings, and the like, as well as initiate, pause, and adjust scanning.

Display device 234 may include one or more display devices utilizing virtually any type of technology. In some embodiments, display device 234 may comprise a computer monitor, and may display MR images and/or parameter maps, including images reconstructed by and parameter maps generated by reconstruction/parameter mapping module 208. Display device 234 may be combined with processor 204, non-transitory memory 206, and/or user input device 232 in a shared enclosure, or may be peripheral display devices and may comprise a monitor, touchscreen, projector, or other display device known in the art, which may enable a user to view MRI images produced by an MRI system, and/or interact with various data stored in non-transitory memory 206.

It should be understood that scan control device 202 shown in FIG. 2 is for illustration, not for limitation. Another appropriate image processing system may include more, fewer, or different components.

Figure 3:
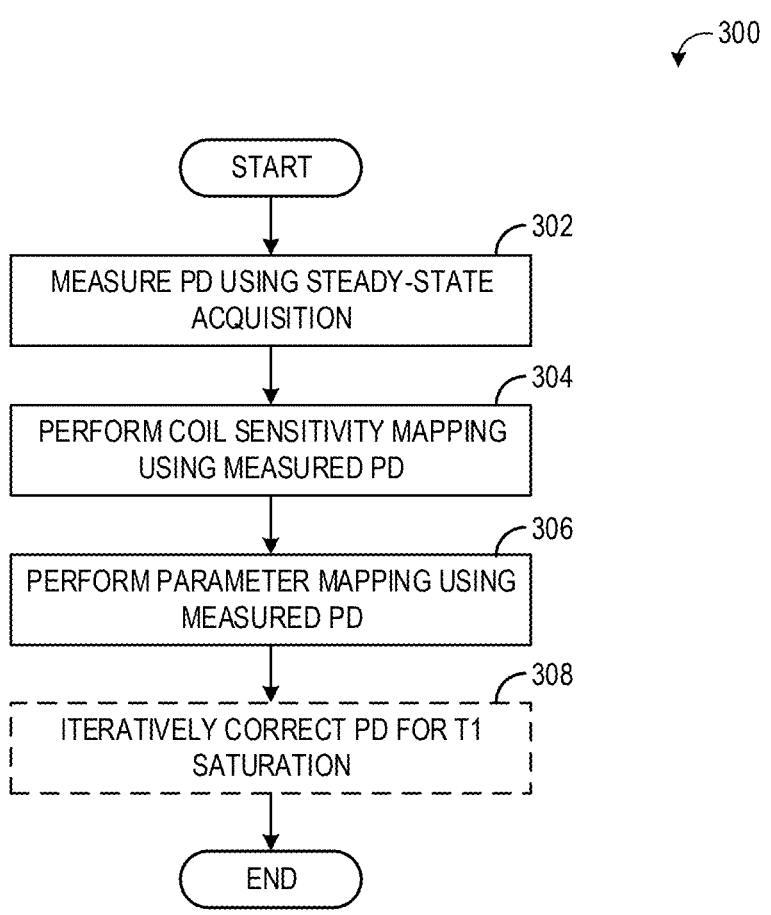
FIG. 3 is flow chart illustrating an example high-level method for measuring proton density (PD) and using the measured PD in downstream processes.

FIG. 3 is a flowchart illustrating a high-level method 300 for an MRI scan, according to an embodiment of the disclosure. Method 300 may be implemented with the scan control device 202 of FIG. 2 in conjunction with the MRI apparatus 10 of FIG. 1. Method 300 may be carried out according to instructions stored in non-transitory memory and executed by a processor, such as non-transitory memory 206 and processor 204 of scan control device 202 of FIG. 2. Method 300 may be carried out in response to initiation of a quantitative MRI scan protocol for parameter mapping and/or in response to initiation of a scan protocol that includes parallel imaging, and thus may be initiated after a patient has been positioned in a bore of the MRI apparatus.

At 302, proton density (PD) is measured using a steady-state acquisition. The steady-state acquisition may include the MRI apparatus being controlled to perform a suitable steady-state pulse sequence, such as a GRE (e.g., SPGR) UTE, or ZTE pulse sequence with a low flip angle (FA) and a repetition time (TR) that is less than the T1 relaxation time of the tissue being imaged. The low FA may include a FA of less than 5° at least in some examples. The steady-state pulse sequence may be carried out to obtain first MR signals (e.g., k-space data) for each of a plurality of slices, and the k-space data may be transformed to the spatial domain. The PD of each voxel of each slice (e.g., the transformed data) may be determined according to the equation, using SPGR as the steady-state pulse sequence:

$$y_{SPGR} = \frac{PD\sin(FA)E_2^*(1-E_1)}{1-E_1\cos(FA)} \cong \frac{PD\,FA}{1+\dfrac{T_1FA^2}{T_R2}}, \qquad \text{(Eq. 1)}$$

$$E_1 = e^{-\frac{T_R}{T_1}}, E_2^* = e^{-\frac{T_E}{T_2^*}} \cong 1$$

In the above equation, $y_{SPGR}$ is the measured signal. Thus, for FAs that fullfill $$1 \gg \frac{T_1}{T_R}\frac{FA^2}{2}.$$

the equation simplifies to $y_{SPGR}$=PD FA. Thus, the specific FA selected for the steady-state acquisition may be based on the T1 for the tissue being imaged and the TR of the steady-state acquisition, such that $$1 \gg \frac{T_1}{T_R}\frac{FA^2}{2}$$

In some examples, the FA may be less than 5°. Therefore, the PD may be determined from the first MR signal (e.g., signal intensity) for each voxel. However, other steady-state acquisitions may be performed to measure the PD, including free-induction-decay (FID) acquisitions such UTE and ZTE.

At 304, coil sensitivity mapping may be performed using the measured PD. For example, when the MRI scan being carried out utilizes a multi-element receive coil, parallel imaging may be performed to obtain MR signals from two or more coil elements of the multi-element receive coil simultaneously, which may speed up imaging. However, the sensitivity of each receive coil element is first determined to enable a weighted combination of images/maps obtained from each coil element. The PD measurements obtained at 302 may include single-coil element PD maps that can be assessed to determine the sensitivity of each receive coil element. For example, the measured single coil element PD maps ($PD_q(r)$ with q counting the receive coils) can be used for parallel imaging coil sensitivity calibration using traditional methods. Thus, $PD_q(r)$ may be used as pseudo coil sensitivity maps in a model-based parallel image reconstruction (e.g., $data_q(k)=PD_q(r)e^{-ikr}$ image(r), with $data_q(k)$ being the measured k-space data and image(r) being the unknown image).

At 306, method 300 includes performing parameter mapping using the measured PD. Additional details of performing parameter mapping using measured PD is provided below with respect to FIG. 4. Briefly, parameter mapping includes the measurement of one or more parameters of interest, such as T1 (longitudinal relaxation time), T2 (transverse relaxation time), T2* (effective transverse relaxation time), and so forth from acquired MR signals. These parameters may be measured during the transient state wherein magnetization is changing. The change in the MR signals over the course of the transient state may be captured as a signal evolution, for each voxel of each slice that is imaged. Each signal evolution may be compared to a dictionary of precomputed signal evolutions that are mapped to values of T1, T2, T2*, and/or other parameters, order to determine quantitative values for each of the parameter(s) of interest. The quantitative values can be used to generate parameter maps, such as T1-weighted images. Typically, parameter mapping includes estimation of the PD from the acquired MR signals, for creation of PD maps and as a scaling factor for parameter estimation. However, estimation of PD during parameter mapping increases the unknowns to be solved during parameter mapping and increases the complexity of the parameter estimation by demanding that the estimation include cross-correlation based parameter estimation, which is known to be imperfect with respect to normalization of the dictionary atoms and hence susceptible to cross-talk. Thus, the step of PD estimation during parameter mapping can be replaced with the directly-measured PD from 302, which may allow a more robust least-squared approach to the parameter estimation. In some examples, the parameter mapping may be performed with parallel imaging, wherein MR signals are received with multiple receive coils simultaneously and combined. In such examples, the coil sensitivity determined at 304 may be used to weight the single-coil images for combination.

In some examples, the measured PD (e.g., measured from the steady-state acquisition) may be iteratively corrected for T1 saturation effects, as indicated at 308. As explained above, the measured signal from the steady-state acquisition ($y_{SPGR}$) is a function of the PD and the FA. Higher FAs may increase the signal and thus the signal to noise ratio. However, higher FAs also cause T1 saturation effects, due to the FA also being in the denominator of the above-described equation 1

$$(\text{e.g., } 1 + \frac{T_1}{T_R}\frac{FA^2}{2}).$$

These T1 saturation effects may be accounted for/corrected by the T1 measured in the parameter mapping. Specifically, the corrected PD may be determined according to the equation:

$$y_{SPGR} \text{ corrected} = y_{SPGR}\left(1 + \frac{T_1}{T_R}\frac{FA^2}{2}\right) \quad \text{(Eq. 2)}$$

Thus, the measured PD may be corrected after an initial round of parameter mapping has been performed based on the measured T1 from the initial round of parameter mapping, and the parameter mapping may be refined (e.g., repeated) using the corrected PD. This process may be repeated one or more times in an iterative manner. Further, it is to be appreciated that the coil sensitivity mapping may be performed with the corrected PD. Method 300 then ends.

Figure 4:
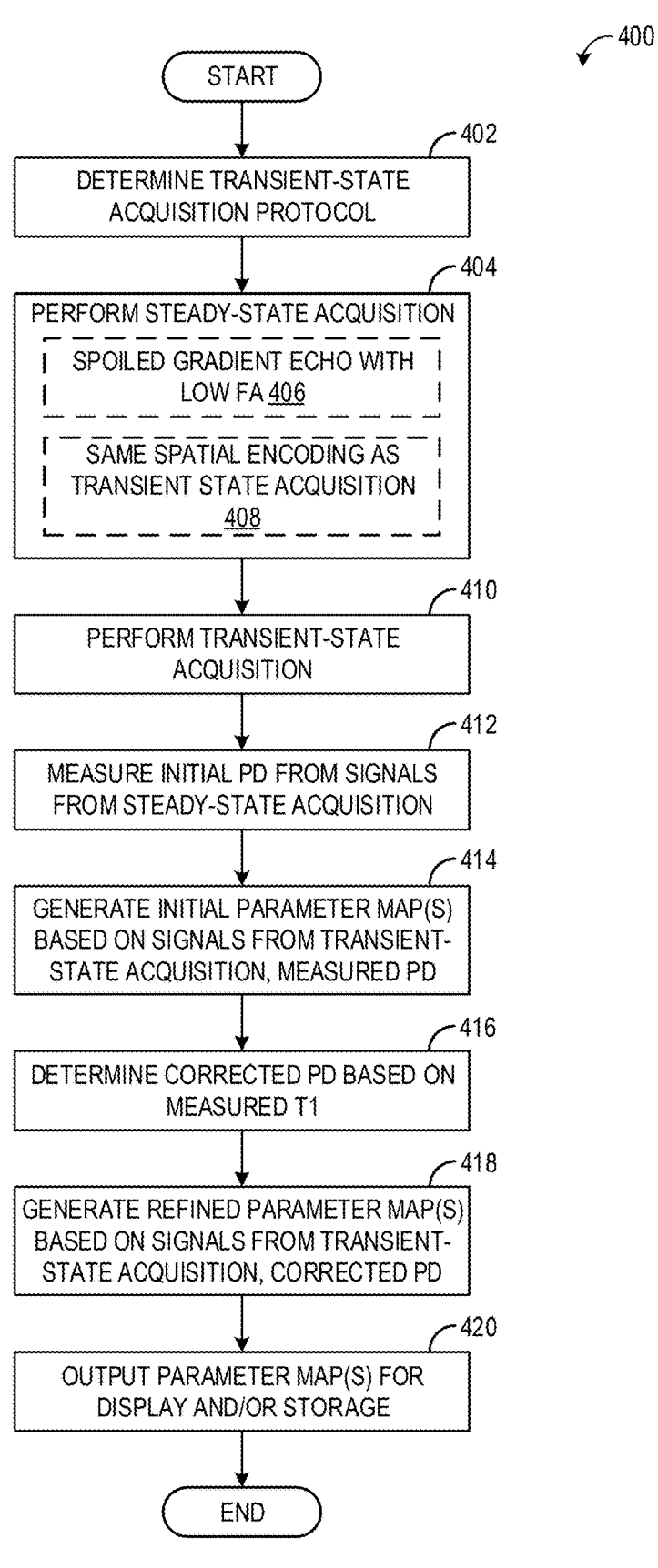
FIG. 4 is a flow chart illustrating an example method for performing quantitative MRI using measured PD.

FIG. 4 is a flowchart illustrating a method 400 for an MRI scan, according to an embodiment of the disclosure. Method 400 may be implemented with the scan control device 202 of FIG. 2 in conjunction with the MRI apparatus 10 of FIG. 1. Method 400 may be carried out according to instructions stored in non-transitory memory and executed by a processor, such as non-transitory memory 206 and processor 204 of scan control device 202 of FIG. 2. Method 400 may be carried out in response to initiation of a quantitative MRI scan protocol for parameter mapping, and thus may be initiated after a patient has been positioned in a bore of the MRI apparatus. In some examples, method 400 is a more detailed version of method 300.

At 402, method 400 includes determining the transient-state acquisition protocol that is to be carried out to perform the parameter mapping. The transient-state acquisition protocol may be a suitable protocol where the measurements (y) are linear with respect to the PD (e.g., y=PD*F(x)). Example transient-state acquisition protocols may include MOLLI, MAGIC, QALAS, MRF, DESPOT, SETI, or modifications thereof.

At 404, a steady-state acquisition is carried out to obtain first MR signals of a scan volume (e.g., a brain of a patient). As explained previously, the steady-state acquisition may include a steady-state pulse sequence, such as a spoiled gradient echo (SPGR) pulse sequence with a low FA and short repetition time, as indicated at 406. The FA may be less than 5° and the TR may be less than T1. The low FA, short TR steady-state pulse sequence may permit direct measurement of the PD of the scan volume on a voxel-by-voxel basis, as explained above with respect to FIG. 3. Further, the first MR signals of the steady-state acquisition may have a spatial encoding that encompasses the spatial encoding of the transient-state acquisition in terms of geometrical coverage (e.g., field of view) and resolution, as indicated at 408. For example, the transient-state acquisition may use a spiral encoding, a Cartesian encoding, or another suitable spatial encoding. The steady-state acquisition may use the same spatial encoding to permit a voxel-to-voxel association of the measured PD and the measurements of the transient-state acquisition. In particular, the field-of-view (FOV) coverage and resolution of the steady-state and transient acquisitions should match, while number of averages or number of (e.g., spiral interleaves) can vary. In other words, by using the same spatial encodings, the PD for a given voxel determined during the steady-state acquisition may reflect the PD of the tissue for that same voxel as measured during the transient-state acquisition.

At 410, the transient-state acquisition is performed to obtain second MR signals of the scan volume. The transient-state acquisition may include performance of a transient-state pulse sequence for the generation and detection of MR signals that include/are weighted for one or more parameters of interest, such as T1 and T2, with signal acquisition occurring during the transient-state. The transient-state acquisition may include MOLLI, MRF, QALAS, or another suitable transient state pulse sequence. For example, the transient-state acquisition may include repeated playouts of a pulse sequence with inversion pulses and signal sampling during recovery of longitudinal magnetization. Additionally, or alternatively, the pulse sequence for the transient-state acquisition may include one or multiple playouts of an acquisition after a T2-prep pulse and a plurality of additional acquisitions after a T1 sensitizing inversion pulse. As a further example, the pulse sequence for the transient-state acquisition may include an MR fingerprinting type encoding with modulation of the flip angle and/or the repetition time. Besides T1 and T2 preparation pulses, also other magneti-zation preparations may be used, such as diffusion prepara-tion, Arterial Spin Labeling (ASL) preparation, etc. The transient acquisition may include the spatial encoding described above, e.g., Cartesian, spiral, radial, etc.

It is to be appreciated that the steady-state acquisition may be performed entirely before the transient-state acquisition is performed. In other examples, the steady-state acquisition may be performed entirely after the transient-state acquisi-tion is performed. In still further examples, the steady-state acquisition may be interleaved with the transient-state acqui-sition. For example, one-quarter of the k-space data for the steady-state acquisition may be acquired, then one-quarter of the k-space data for the transient-state acquisition may be acquired, another quarter of the k-space data for the steady-state acquisition may be acquired, followed by another quarter of the k-space data for the transient-state acquisition, etc. In still further examples, the interleaving may be slice-by-slice (e.g., k-space data for one slice of the steady-state acquisition may be obtained, then k-space data for one slice of the transient-state acquisition may be obtained, etc.). Interleaving the segments/pulse sequences of the steady-state acquisition and the transient-state acquisition may reduce motion-related artifacts in the parameter maps. Addi-tionally, or alternatively, motion-correction techniques may be applied to reduce motion-related artifacts.

At 412, an initial PD for each voxel of the scan volume is measured from the first MR signals obtained during the steady-state acquisition, as explained above with respect to FIG. 3. In some examples, parallel imaging may be used during the steady-state acquisition, wherein more than one RF coil is used to measure a given voxel's PD. In such examples, single-coil element images may be generated from the first MR signals and combined to generate one overall PD image (e.g., per slice), with the combination weighted based on the overall signal intensity of each single-coil element image, and the PD of each voxel deter-mined from the overall PD images. At 414, one or more initial parameter maps are generated based on the second MR signals obtained during the transient-state acquisition and the initial measured PD. As explained previously, quan-titative parameter mapping estimates N unknown MR prop-erties $x=\{x_1, x_2, \ldots x_N\}$ from a set of M measurements $y=\{y_1, y_2, \ldots y_M\}$ where each measurement m is obtained with certain/distinct parameter settings $p_m=\{p_{1,m}, p_{2,m}, \ldots p_{K,m}\}$ based on a physics-inspired, non-linear, signal model (F):

$$y_m = PD\ F(x, p_m)$$

Usually, the non-linear qPM estimation is performed in the spatial domain for each voxel separately (i.e., $y_m=y_m(r)$, $x_n=x_n(r)$) using dictionary matching wherein a signal evo-lution of each voxel is matched to a dictionary entry based on the shape of the signal evolution. The measured proton density $$PD = \frac{y_{SPGR}}{FA}$$

then simplifies the non-linear signal model to:

$$\tilde{y}_m = \frac{y_m}{PD} = \frac{y_m FA}{y_{SPGR}} = F(x, p_m).$$

Thus, each measurement of the transient-state acquisition (e.g., each signal evolution generated by the second MR signals) may be scaled by the measured PD for the corre-sponding voxel. This focuses the qPM on the MR properties of interest $x=\{x_1, x_2, \ldots x_N\}$ (e.g., T1, T2, T2*, . . . relaxation times) by measuring the less-interesting (but still necessary) PD scaling factor and eliminating it from the non-linear fit. This then leads to a better conditioned and hence more efficient qPM estimation. Therefore, each sec-ond MR signal is a function of an MR property (e.g., T1) and the scan parameter settings. The value of the MR property can be determined by matching the scaled signal evolution for each voxel to an entry from a precomputed dictionary using least-squared fitting or dictionary matching. The iden-tified entry from the dictionary thus includes the estimated parameter(s), as the dictionary maps a plurality of signal evolutions to parameter values using Bloch equations, for example. In case of solving the non-linear qPM problem using dictionary matching, the proposed method eliminates the problem of parameter estimation via normalized cross correlation which is known to be sensitive to ill-conditioning and cross-talk (primarily because its difficult/impossible to normalize the dictionary atoms in a fair and unbiased manner). More specifically, the proposed method allows using least-square fitting (or least-square dictionary match-ing) by comparing the PD-normalized, measured signal evaluations $$(\tilde{y}_m = \frac{y_m}{PD})$$

with the physics-inspired, non-linear signal model ($F(x, p_m)$) in a least-squares sense.

Thus, the second MR signals/measurements for each imaged voxel from the transient-state acquisition may be used along with the measured PD for each voxel to deter-mine one or more parameter values, such as a value for T1, a value for T2, etc., for each voxel. Specifically, k-space data of the scan volume may be acquired during the transient acquisition, for each slice of the scan volume and by each coil of the surface/receive RF coil unit (e.g., RF coil unit 14). The k-space data may be transformed to the spatial domain, resulting in a plurality of images for each slice (e.g., one per imaged segment of the changing magnetization, whether with T1 contrast, T2 contrast, or both). Each image may be normalized based on the measured PD for the voxels of that image. When parallel imaging is used, a plurality of single-coil images may be generated that may be combined to generate an image for each slice of the scan volume for each imaged segment, wherein the images are combined based on the measured PD images as coil sensitivity calibration maps to thereby normalize the images by measured PD. A signal evolution may be generated for each voxel based on the images of that voxel, wherein the intensity value of voxel across the images is plotted over time/image order. The signal evolution may be compared to the precomputed dictionary and the best-matching dictionary entry may be identified in a least-squares sense. The best-matching dic-tionary entry is mapped to a T1 value, a T2 value, a T2* value, or combinations thereof. The T1, T2, and/or T2* values for each voxel may be used to set an intensity value and/or color for each voxel, and one or more parameter maps may be generated. For example, a T1 map may be generated that includes a color and/or intensity value for each voxel based on the T1 values determined as explained above, and an image may be generated using maximum intensity projection, for example. While the above description includes parameters being estimated for each voxel, in some examples the same process may be used for 2D imaging where each pixel value is determined as explained above.

At 416, method 400 includes determining a corrected PD based on the measured T1 (e.g., each T1 value determined from the initial parameter maps). For example, for each voxel, the PD for that voxel may be corrected based on the T1 value for that voxel, wherein the T1 value for that voxel is determined from the initial parameter maps. Each PD (e.g., for each voxel) may be corrected according to equation 2 as described above.

At 418, method 400 includes generating one or more refined parameter maps based on the signals from the transient-state acquisition and the corrected PD. The refined parameter maps may be generated as explained above (e.g., similar to the generation of the initial parameter maps), using the corrected PD rather than the initial PD. The process of correcting the PD and refining the parameter maps may be performed once, as shown, or may be performed more than once in an iterative manner.

At 420, the refined parameter map(s) may be output for display on a display device (e.g., display device 234) and/or output for storage (e.g., long term storage such as on a PACS or other image archive). In some examples, the estimated parameters may be used to generate various contrast-weighted images, referred to as synthetic MR images, such as T1-weighted images. Further, in some examples, the individual images used to generate the parameter maps as described above (and described below with respect to FIG. 8) may also be saved and/or output for display. Method 400 then ends.

Thus, methods 300 and 400 provide a method for qMR mapping that may be performed by an MRI system, such as the MRI apparatus 10 of FIG. 1. The method may include performing a steady-state acquisition to obtain first MR signals of a scan volume, as described above with respect to 302 of method 300 and 404 of method 400, and performing a transient-state acquisition to obtain second MR signals of the scan volume, as described above with respect to 306 of method 300 and 410 of method 400. The method may further include determining, for each voxel of the scan volume, a respective PD based on the first MR signals, as explained above with respect to 412 of method 400, and determining, for each voxel of the scan volume, one or more respective quantitative MR (qMR) parameters based on the second MR signals and the respective PD for that voxel, as described above with respect to 414 of method 400. One or more parameter maps may be output for display and/or storage based on the one or more respective qMR parameters, as described above with respect to 416 of method 400.

As explained previously, the steady-state acquisition may include read-out (e.g., signal acquisition) of the first MR signals during steady-state magnetization, and the transient-state acquisition may include read-out (e.g., signal acquisition) of the second MR signals during transient (e.g., changing) magnetization. The steady-state acquisition may include playouts of a steady-state pulse sequence, such as a spoiled gradient echo pulse sequence, and in some examples, the steady-state pulse sequence has a small flip angle (e.g., less than) 5° and a repetition time of less than T1. The transient-state acquisition may include playouts of RF pulses and magnetic field gradient pulses to generate T1 contrast and/or T2 contrast. For example, the transient-state acquisition may include playouts of inversion pulses and read-out of the second MR signals during recovery of longitudinal magnetization. As another example, the transient-state acquisition may include playouts of read-out of the second MR signals after a T2-prep pulse and a plurality of read-outs of the second MR signals after a T1-prep pulse. The first MR signals may be spatially encoded with the same spatial encoding (e.g., same field-of-view and same resolution) as the second MR signals.

In some examples, the second MR signals collectively form a set of measurements, and determining the one or more qMR parameters may include scaling each respective measurement from the set of measurements by a corresponding PD and performing least-squares dictionary fitting with each scaled measurement to determine the one or more qMR parameters. For example, each measurement may include a respective signal evolution, and determining the one or more qMR parameters may include scaling each respective signal evolution by the corresponding PD and performing dictionary fitting with each scaled signal evolution relative to a precomputed dictionary.

As explained at 304 of method 300, a respective set of first MR signals may be obtained from each of a plurality of receive coils, and coil sensitivity calibration may be performed based on each respective set of first MR signals.

Further, in some examples, determining, for each voxel of the scan volume, the respective PD based on the first MR signals may include determining, for each voxel of the scan volume, a respective first PD based on the first MR signals; and determining, for each voxel of the scan volume, one or more respective qMR parameters based on the second MR signals and the respective PD for that voxel may include determining, for each voxel of the scan volume, an initial T1 value based on the second MR signals and the respective first PD for that voxel. The method may further include correcting each respective first PD based on the initial T1 value for that voxel to generate a respective second PD for each voxel of the scan volume; and determining, for each voxel of the scan volume, one or more respective refined qMR parameters based on the second MR signals and the respective second PD for that voxel. Further, the one or more parameter maps that are output for display and/or storage based on the one or more respective qMR parameters may include one or more parameter maps that are generated based on the one or more respective refined qMR parameters. In this way, particularly when high signal to noise ratio is desired and thus the FA used in the steady-state acquisition is relatively high (e.g., 3-5°, an iterative correction process may be performed to correct the initial measured PD based on the estimated T1 (e.g., estimated from the parameter mapping). In the first iteration, the measured PD is used as is (e.g., PD1=PD_measured) and the parameter maps T1_1 and T2_1 (_1 indicates first iteration) are obtained. In the second iteration, the PD is corrected for T1 saturation effects such that PD2=PD_measured*(1+FA^2/2*T1_1/TR) and refined parameter maps T1_2 and T2_2 (_2 indicates second iteration) are obtained. In the (optional) third iteration, the PD is refined for T1 saturation effects such that PD3=PD_measured*(1+FA^2/2*T1_2/TR) and refined parameter maps T1_3 and T2_3 (_3 indicated third iteration) are obtained. It is to be appreciated that when the iterative correction is performed, the initial parameter maps (e.g., T1_1 and T2_1) may not be displayed and may not be converted to a displayable format (e.g., the initial parameter maps may be maintained as a matrix of T1 and T2 values and not color coded and converted to an image as explained above).

Methods 300 and 400 further provide for obtaining, for each voxel of a scan volume imaged with the MRI system, a respective PD-normalized signal evolution, each PD-normalized signal evolution generated from first MR signals of the scan volume obtained with the MRI system during a steady-state acquisition and second MR signals of the scan volume obtained with the MRI system during a transient-state acquisition. A first parameter value and a second parameter value may be determined for each voxel of the scan volume based on each PD-normalized signal evolution using least-squared dictionary fitting (e.g., parameter maps may be generated from the PD-normalized signal evolutions that include values for T1 and T2, for example). Additionally, for each voxel of the scan volume, a respective corrected PD-normalized signal evolution may be obtained, wherein each corrected PD-normalized signal evolution is generated from the second MR signals of the scan volume and a respective corrected measured PD. Each respective corrected measured PD may include the measured PD that is corrected based on the first parameter value for that voxel. A refined first parameter value and a refined second parameter value for each voxel of the scan volume may be determined based on each corrected PD-normalized signal evolution using least-squared dictionary fitting and one or more parameter maps for the refined first parameter value and the refined second parameter value of each voxel of the scan volume may be generated (e.g., refined parameter maps may be generated using the corrected PDs and the signal evolutions, with each signal evolution normalized by the corresponding corrected PD). The one or more parameter maps may be output for display on a display device and/or for storage.

FIG. 5 shows an example plot 500 depicting magnetization as a function of time during a steady-state acquisition carried out as described above with respect to FIGS. 3 and 4. In plot 500, magnetization (e.g., the magnitude of the net magnetization at equilibrium along the Z-axis of the MRI bore) is depicted along the vertical axis (e.g., y axis) and time is depicted along the horizontal (e.g., x axis). Following an RF pulse of low FA, as described above, the net magnetization may reach steady-state wherein the magnetization is not changing. During the steady-state magnetization, the resultant MR signals may be sampled (e.g., by the RF coil unit 14) during one or more image acquisition segments. It is to be appreciated that the steady-state acquisition may include steady-state-type pulse sequences (e.g., SPGR, FISP, UTE, or ZTE) performed multiple times to acquire sufficient k-space data to generate parameter maps of the scan volume.

FIG. 6 shows a set of proton density-weighted images 600 that may be reconstructed from k-space data obtained during the image acquisition segments of the steady-state acquisition described herein (e.g., as described above with respect to FIGS. 3 and 4 and shown in plot 500 of FIG. 5). The set of proton density-weighted images 600 may include a first image 602 showing an axial view of a brain of a patient, a second image 604 showing a sagittal view of the brain of the patient, and a third image 606 showing a coronal view of the brain of the patient.

FIG. 7 shows an example plot 700 depicting magnetization as a function of time during a transient-state acquisition carried out as described above with respect to FIGS. 3 and 4. In plot 700, magnetization (e.g., the magnitude of the net magnetization at equilibrium along the Z-axis of the MRI bore) is depicted along the vertical axis (e.g., y axis) and time is depicted along the horizontal (e.g., x axis). The transient-state acquisition shown in FIG. 7 is a QALAS pulse sequence that includes a T2-prep pulse 702 and a first image acquisition segment 704 following the T2-prep pulse 702. The QALAS pulse sequence further includes a T1-prep pulse 706 (e.g., an inversion pulse) and a plurality of additional acquisitions after the T1-prep pulse, including a second image acquisition segment 708, a third image acquisition segment 710, and a fourth image acquisition segment 712. Following the T2-prep pulse, the net magnetization may change (e.g., the magnetization may increase in magnitude over time) and the first image acquisition segment 704 may occur while the magnetization is changing (e.g., during the first image acquisition segment 704, resultant MR signals are sampled with the RF coil unit 14). Likewise, following the T1-prep pulse, the net magnetization may change (e.g., increase in magnitude over time) and each of the second image acquisition segment 708, the third image acquisition segment 710, and the fourth image acquisition segment 712 may occur while the magnetization is changing (e.g., during the second, third, and fourth image acquisition segments, resultant MR signals are sampled with the RF coil unit 14).

It is to be appreciated that the sequence shown in FIG. 7 (e.g., a T2-prep pulse followed by a first image acquisition segment and a T1-prep pulse followed by three additional image acquisition segments) may be repeated such that the k-space data are encoded over multiple repetitions. In some examples, each image acquisition segment may be a single or multi-shot acquisition that acquires sufficient k-space data to generate an image of a slice, while in other examples, the sequence shown in FIG. 7 may be repeated multiple times to obtain sufficient k-space data for reconstructing an image of the 2D slice or 3D volume. Further, while three image acquisition segments are shown following the T1-prep pulse, in some examples different numbers of image acquisition segments may be performed following each T1-prep pulse.

FIG. 8 shows a set of images 800 that may be reconstructed from k-space data obtained during the image acquisition segments of the transient-state acquisition described herein (e.g., as described above with respect to FIGS. 3 and 4 and shown in plot 700 of FIG. 7). The set of images 800 includes a set of T2-weighted images 801 reconstructed from k-space data acquired during the first image acquisition segment 704; a set of first T1-weighted images 810 reconstructed from k-space data acquired during the second image acquisition segment 708; a set of second T1-weighted images 820 reconstructed from k-space data acquired during the third image acquisition segment 710; and a set of third T1-weighted images 830 reconstructed from k-space data acquired during the fourth image acquisition segment 712. Each set of images (e.g., the set of T2-weighted images 801, the set of first T1-weighted images 810, the set of second T1-weighted images 820, and the set of third T1-weighted images 830) includes a first image showing an axial view of a brain of a patient (e.g., the same brain of the same patient of the set of images 600 of FIG. 6), a second image showing a sagittal view of the brain of the patient, and a third image showing a coronal view of the brain of the patient. In some examples, the transient-state acquisition may be carried out with parallel imaging wherein multiple RF receive coil elements are sampled simultaneously. The single-coil element images from the steady-state acquisition may be used as coil sensitivity maps during reconstruction of the set of images 800, which may result in PD-normalized images.

FIG. 9 shows example parameter maps 900 that may be generated from the set of images 600 and the set of images 800 and according to the methods of FIGS. 3 and 4. The first example parameter maps 900 include a set of T1 maps 901 and a set of T2 maps 910. Similar to the images of FIGS. 6 and 8, the set of T1 maps 901 includes an axial T1 map, a sagittal T1 map, and a coronal T1 map of the brain of the patient and the set of T2 maps 910 includes an axial T2 map, a sagittal T2 map, and a coronal T2 map of the brain of the patient. The parameter maps are quantitative and the grayscale value of each pixel corresponds to a T1 value (e.g., time in seconds) or a T2 value (e.g., time in seconds) shown by the respective legends to the right of each set of parameter maps. Thus, the PD-normalized signal evolutions generated from the PD measured during the steady-state acquisition and the images obtained during the transient-state acquisition are mapped to T1 and T2 values by comparing the PD-normalized signal evolutions to a precomputed dictionary of signal evolutions and each PD-normalized signal evolution is matched with a dictionary entry using least-squared fitting. The T1 value of the matching dictionary entry for a given voxel is used as the grayscale value for that voxel in the set of T1 maps 901 and the T2 value of the matching dictionary entry for the given voxel is used as the grayscale value for that voxel in the set of T2 maps 910.

FIG. 10 shows a second example of parameter maps 1000 that includes a first set of parameter maps 1001 generated with conventional methods that do not take into account measured PD and a second set of parameter maps that may be generated according to methods 300 and 400. The first set of parameter maps 1001 and the second set of parameter maps 1010 may be generated from the same k-space data obtained using MR fingerprinting as the transient-state acquisition. The first set of parameter maps 1001 includes a PD map 1002, a T1 map 1004, and a T2 map 1006, each generated with conventional dictionary matching (e.g., wherein the shape of each signal evolution is matched to a corresponding dictionary entry). The second set of parameter maps 1010 includes a PD map 1012 generated based on MR signals obtained during a steady-state acquisition, as described above with respect to FIGS. 3, 4, and 5, a T1 map 1014, and a T2 map 1016. The T1 map 1014 and the T2 map 1016 may be generated from PD-normalized signal evolutions and least-squared dictionary fitting, as explained above with respect to FIGS. 3 and 4. As appreciated by comparing the first set of parameter maps 1001 to the second set of parameter maps 1010, the measured PD map (PD map 1012) may more accurately determine PD relative to the estimated PD shown by the PD map 1002. More specifically, structures with long T1 (e.g., cerebrospinal fluid in the ventricles, blood, etc.) show T1 saturation effects in the PD map 1002 which is not the case for the PD map 1012. Accordingly, and related to error propagation, also the quantitative T1 and T2 parameter maps generated according to the embodiments of the disclosure (e.g., the T1 map 1014 and the T2 map 1016) are more accurate than the T1 map 1004 and the T2 map 1006 generated with conventional methods.

Figure 11:
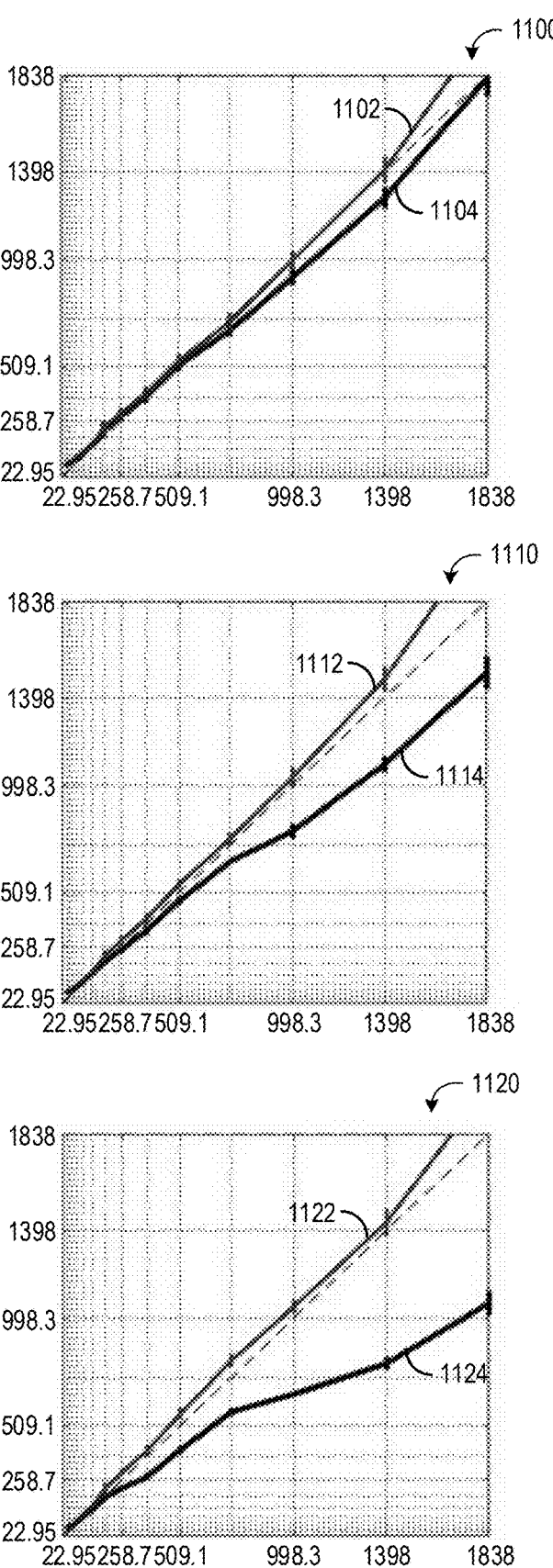
FIG. 11 shows a set of plots depicting quantitative T1 values determined from k-space data acquired at a plurality of flip angles, with and without correction for T1 saturation effects.

FIG. 11 shows a set of plots depicting quantitative T1 measurement of a quantitative NIST/ISMRM phantom imaged as disclosed herein, including a transient-state acquisition for quantitative parameter mapping (herein, an inversion-recovery preparation) followed by multiple segmented SPGR readouts and an SPGR steady-state acquisition with different flip angles of 0.9° (shown in plot 1100, with minimal T1 saturation), 1.8° (shown in plot 1110), and 3° (shown in plot 1120, with strong T1 saturation effects). Each plot shows estimated T1 values as a function of known T1 values (e.g., as the T1 values of the phantom are known). Each plot includes two curves, one depicting T1 values estimated without correcting the PD and one depicting T1 values estimated with the iterative correction of the measured PD based on the initial estimated T1. Specifically, plot 1100 includes a first curve 1102 depicting T1 values with correction and a second curve 1104 depicting T1 values without correction; plot 1110 includes a first curve 1112 depicting T1 values with correction and a second curve 1114 depicting T1 values without correction; and plot 1120 includes a first curve 1122 depicting T1 values with correction and a second curve 1124 depicting T1 values without correction. The dashed line in each plot depicts an ideal curve, if the estimated T1 values matched the actual T1 values. Without the correction, T1 values are underestimated, as appreciated by each of the second curves. Further, as FA increases, the underestimation of T1 values increases (e.g., the T1 saturation effects become more pronounced). However, with the correction, even the highest FA (e.g., of 3° shown in plot 1120) allows accurate T1 measurement. Thus, by correcting the PD by the initial estimated T1, higher FAs may be used to increase signal to noise ratio while still providing accurate parameter estimation.

A technical effect of measuring PD with a steady-state acquisition is that the measured PD may be used during quantitative parameter mapping to reduce the unknowns from the fit performed to estimate the parameters and replace cross-correlation based dictionary-matching by least-square fitting (or least-square dictionary matching). Another technical effect of measuring PD is the measured PD from each RF coil may be used as pseudo coil sensitivity maps to provide signal normalization (e.g., eliminates the PD as an unknown from the quantitative parameter mapping signal equation) and coil sensitivity calibration for parallel imaging.

The disclosure also provides support for a method for magnetic resonance imaging (MRI) of a patient, comprising: performing a steady-state acquisition to obtain first MR signals of a scan volume, performing a transient-state acquisition to obtain second MR signals of the scan volume, determining, for each voxel of the scan volume, a respective proton density (PD) based on the first MR signals, determining, for each voxel of the scan volume, one or more respective quantitative MR (qMR) parameters based on the second MR signals and the respective PD for that voxel, and outputting one or more parameter maps for display and/or storage based on the one or more respective qMR parameters. In a first example of the method, the steady-state acquisition comprises read-out of the first MR signals during steady-state magnetization, and wherein the transient-state acquisition comprises read-out of the second MR signals during transient-state magnetization. In a second example of the method, optionally including the first example, the steady-state acquisition comprises playouts of gradient echo, ultra-short TE, or zero TE pulse sequences. In a third example of the method, optionally including one or both of the first and second examples, the gradient echo, ultra-short TE, or zero TE pulse sequences have a flip angle of less than 5° and a repetition time of less than T1. In a fourth example of the method, optionally including one or more or each of the first through third examples, the transient-state acquisition comprises playouts of RF pulses and magnetic field gradient pulses to generate T1 contrast and/or T2 contrast, the transient-state acquisition comprises playouts of inversion pulses and read-out of the second MR signals during recovery of longitudinal magnetization, the transient-state acquisition comprises playouts of read-out of the second MR signals after a T2-prep pulse and a plurality of read-outs of the second MR signals after a T1-prep pulse or the transient-state acquisition comprises an MR fingerprinting type encoding with modulation of the flip angle and/or the repetition time. In a fifth example of the method, optionally including one or more or each of the first through fourth examples, determining, for each voxel of the scan volume, the respective PD based on the first MR signals comprises determining, for each voxel of the scan volume, a respective first PD based on the first MR signals, and determining, for each voxel of the scan volume, one or more respective qMR parameters based on the second MR signals and the respective PD for that voxel comprises determining, for each voxel of the scan volume, an initial T1 value based on the second MR signals and the respective first PD for that voxel, and further comprising: correcting each respective first PD based on the initial T1 value for that voxel to generate a respective second PD for each voxel of the scan volume, and determining, for each voxel of the scan volume, one or more respective refined qMR parameters based on the second MR signals and the respective second PD for that voxel. In a sixth example of the method, optionally including one or more or each of the first through fifth examples, outputting one or more parameter maps for display and/or storage based on the one or more respective qMR parameters comprises outputting one or more parameter maps for display and/or storage based on the one or more respective refined qMR parameters. In a seventh example of the method, optionally including one or more or each of the first through sixth examples, the first MR signals are spatially encoded with a geometrical-coverage (e.g., field of view) and resolution which encompasses a spatial encoding of the second MR signals. In an eighth example of the method, optionally including one or more or each of the first through seventh examples, the second MR signals collectively form a set of measurements, and wherein determining the one or more respective qMR parameters comprises scaling each respective measurement from the set of measurements by a corresponding PD and performing fitting or dictionary matching in a least-squares dictionary sense with each scaled measurement to determine the one or more respective qMR parameters. In a ninth example of the method, optionally including one or more or each of the first through eighth examples, each measurement comprises a respective signal evolution, and determining the one or more respective qMR parameters comprises scaling each respective signal evolution by the corresponding PD and performing dictionary matching or fitting with each scaled signal evolution relative to a precomputed dictionary. In a tenth example of the method, optionally including one or more or each of the first through ninth examples, obtaining the first MR signals comprises obtaining a respective set of first MR signals from each of a plurality of receive coil elements, and further comprising performing coil sensitivity calibration based on each respective set of first MR signals.

The disclosure also provides support for a system, comprising: a display device, one or more processors, and memory storing instructions executable by the one or more processors to: obtain, for each voxel of a scan volume, first MR signals using a steady-state pulse sequence, obtain, for each voxel of the scan volume, second MR signals using a transient-state pulse sequence, determine, for each voxel of the scan volume, a respective first proton density (PD) based on the first MR signals, determine, for each voxel of the scan volume, one or more respective quantitative MR (qMR) parameters based on the second MR signals and the respective first PD for that voxel, wherein the one or more respective qMR parameters includes a T1 value for each voxel of the scan volume, the respective first PD based on the T1 value for that voxel to generate a respective second PD for each voxel, determine, for each voxel of the scan volume, one or more respective refined qMR parameters based on the second MR signals and the respective second PD for that voxel, and output one or more parameter maps for display on the display device and/or for storage based on the one or more respective refined qMR parameters. In a first example of the system, the one or more respective qMR parameters further comprise one or more of T1, T2 and T2*. In a second example of the system, optionally including the first example, the steady-state pulse sequence comprises a gradient echo, ultra-short TE, or zero TE pulse sequence. In a third example of the system, optionally including one or both of the first and second examples, the steady-state pulse sequence has a flip angle of less than 5° and a repetition time of less than T1.

The disclosure also provides support for a method for a magnetic resonance imaging (MRI) system, comprising: obtaining, for each voxel of a scan volume imaged with the MRI system, a respective proton density (PD)-normalized signal evolution, each PD-normalized signal evolution generated from first MR signals of the scan volume obtained with the MRI system during a steady-state acquisition and second MR signals of the scan volume obtained with the MRI system during a transient-state acquisition, determining a first parameter value and a second parameter value for each voxel of the scan volume based on each PD-normalized signal evolution using least-squared dictionary fitting, obtaining, for each voxel of the scan volume, a respective corrected PD-normalized signal evolution, each corrected PD-normalized signal evolution generated from the second MR signals of the scan volume and a respective corrected measured PD, each respective corrected measured PD corrected based on the first parameter value for that voxel, determining a refined first parameter value and a refined second parameter value for each voxel of the scan volume based on each corrected PD-normalized signal evolution using least-squared dictionary fitting, generating one or more parameter maps for the refined first parameter value and the refined second parameter value of each voxel of the scan volume, and outputting the one or more parameter maps for display on a display device and/or for storage. In a first example of the method, the steady-state acquisition comprises playouts of a gradient echo, ultra-short TE, or zero TE pulse sequence. In a second example of the method, optionally including the first example, the gradient echo, ultra-short TE, or zero TE pulse sequence has a flip angle of less than 5° and a repetition time of less than T1. In a third example of the method, optionally including one or both of the first and second examples, the first parameter value comprises a T1 value and the second parameter value comprises a T2 value, and wherein the transient-state acquisition comprises playouts of RF pulses and magnetic field gradient pulses to generate T1 contrast and/or T2 contrast. In a fourth example of the method, optionally including one or more or each of the first through third examples, the transient-state acquisition comprises playouts of inversion pulses and read-out of the second MR signals during recovery of longitudinal magnetization.

As used herein, an element or step recited in the singular and preceded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for magnetic resonance imaging (MRI) of a patient, comprising:
   performing a steady-state acquisition to obtain first MR signals of a scan volume;
   performing a transient-state acquisition to obtain second MR signals of the scan volume;
   determining, for each voxel of the scan volume, a respective proton density (PD) based on the first MR signals;
   determining, for each voxel of the scan volume, one or more respective quantitative MR (qMR) parameters based on the second MR signals and the respective PD for that voxel; and
   outputting one or more parameter maps for display and/or storage based on the one or more respective qMR parameters.

2. The method of claim 1, wherein the steady-state acquisition comprises read-out of the first MR signals during steady-state magnetization, and wherein the transient-state acquisition comprises read-out of the second MR signals during transient-state magnetization.

3. The method of claim 2, wherein the steady-state acquisition comprises playouts of gradient echo, ultra-short TE, or zero TE pulse sequences.

4. The method of claim 3, wherein the gradient echo, ultra-short TE, or zero TE pulse sequences have a flip angle of less than 5° and a repetition time of less than T1.

5. The method of claim 2, wherein:
   the transient-state acquisition comprises playouts of RF pulses and magnetic field gradient pulses to generate T1 contrast and/or T2 contrast;
   the transient-state acquisition comprises playouts of inversion pulses and a plurality of read-outs of the MR signals during recovery of longitudinal magnetization; or
   the transient-state acquisition comprises playouts of read-out of the second MR signals after a T2-prep pulse and a plurality of read-outs of the MR signals after a T1-prep pulse; or
   the transient-state acquisition comprises an MR fingerprinting type encoding with modulation of the flip angle and/or the repetition time.

6. The method of claim 1, wherein:
   determining, for each voxel of the scan volume, the respective PD based on the first MR signals comprises determining, for each voxel of the scan volume, a respective first PD based on the first MR signals; and
   determining, for each voxel of the scan volume, one or more respective qMR parameters based on the second MR signals and the respective PD for that voxel comprises determining, for each voxel of the scan volume, an initial T1 value based on the second MR signals and the respective first PD for that voxel; and
   further comprising:
   correcting each respective first PD based on the initial T1 value for that voxel to generate a respective second PD for each voxel of the scan volume; and
   determining, for each voxel of the scan volume, one or more respective refined qMR parameters based on the second MR signals and the respective second PD for that voxel.

7. The method of claim 6, wherein outputting one or more parameter maps for display and/or storage based on the one or more respective qMR parameters comprises outputting one or more parameter maps for display and/or storage based on the one or more respective refined qMR parameters.

8. The method of claim 1, wherein the first MR signals are spatially encoded with a geometrical-coverage and resolution which encompasses a spatial encoding of the second MR signals.

9. The method of claim 1, wherein the second MR signals collectively form a set of measurements, and wherein determining the one or more respective qMR parameters comprises scaling each respective measurement from the set of measurements by a corresponding PD and performing fitting or dictionary-matching in a least-squares sense with each scaled measurement to determine the one or more respective qMR parameters.

10. The method of claim 9, wherein each measurement comprises a respective signal evolution, and determining the one or more respective qMR parameters comprises scaling each respective signal evolution by the corresponding PD and performing fitting or dictionary-matching with each scaled signal evolution relative to a precomputed dictionary.

11. The method of claim 1, wherein obtaining the first MR signals comprises obtaining a respective set of first MR signals from each of a plurality of receive coil elements, and further comprising performing coil sensitivity calibration based on each respective set of first MR signals.

12. A system, comprising:

a display device;

one or more processors; and memory storing instructions executable by the one or more processors to:

obtain, for each voxel of a scan volume, first MR signals using a steady-state pulse sequence;

obtain, for each voxel of the scan volume, second MR signals using a transient-state pulse sequence;

determine, for each voxel of the scan volume, a respective first proton density (PD) based on the first MR signals;

determine, for each voxel of the scan volume, one or more respective quantitative MR (qMR) parameters based on the second MR signals and the respective first PD for that voxel, wherein the one or more respective qMR parameters includes a T1 value for each voxel;

correct, for each voxel of the scan volume, the respective first PD based on the T1 value for that voxel to generate a respective second PD for each voxel;

determine, for each voxel of the scan volume, one or more respective refined qMR parameters based on the second MR signals and the respective second PD for that voxel; and output one or more parameter maps for display on the display device and/or for storage based on the one or more respective refined qMR parameters.

13. The system of claim 12, wherein the one or more respective qMR parameters further comprise one or more of T2 and T2*.

14. The system of claim 12, wherein the steady-state pulse sequence comprises a gradient echo, ultra-short TE, or zero TE pulse sequence.

15. The system of claim 14, wherein the steady-state pulse sequence has a flip angle of less than 5° and a repetition time of less than T1.

16. A method for a magnetic resonance imaging (MRI) system, comprising:

obtaining, for each voxel of a scan volume imaged with the MRI system, a respective proton density (PD)-normalized signal evolution, each PD-normalized signal evolution generated from first MR signals of the scan volume obtained with the MRI system during a steady-state acquisition and second MR signals of the scan volume obtained with the MRI system during a transient-state acquisition;

determining a first parameter value and a second parameter value for each voxel of the scan volume based on each PD-normalized signal evolution using least-squared dictionary fitting;

obtaining, for each voxel of the scan volume, a respective corrected PD-normalized signal evolution, each corrected PD-normalized signal evolution generated from the second MR signals of the scan volume and a respective corrected measured PD, each respective corrected measured PD corrected based on the first parameter value for that voxel;

determining a refined first parameter value and a refined second parameter value for each voxel of the scan volume based on each corrected PD-normalized signal evolution using least-squared dictionary fitting;

generating one or more parameter maps for the refined first parameter value and the refined second parameter value of each voxel of the scan volume; and outputting the one or more parameter maps for display on a display device and/or for storage.

17. The method of claim 16, wherein the steady-state acquisition comprises playouts of a gradient echo, ultra-short TE, or zero TE pulse sequence.

18. The method of claim 17, wherein the gradient echo, ultra-short TE, or zero TE pulse sequence has a flip angle of less than 5° and a repetition time of less than T1.

19. The method of claim 16, wherein the first parameter value comprises a T1 value and the second parameter value comprises a T2 value, and wherein the transient-state acquisition comprises playouts of RF pulses and magnetic field gradient pulses to generate T1 contrast and/or T2 contrast.

20. The method of claim 16, wherein the transient-state acquisition comprises playouts of inversion pulses and readout of the second MR signals during recovery of longitudinal magnetization.

* * * * *